United States Patent
Rameau

(10) Patent No.: US 9,830,406 B2
(45) Date of Patent: Nov. 28, 2017

(54) COMPUTER-IMPLEMENTED METHOD FOR DESIGNING AN INDUSTRIAL PRODUCT MODELED WITH A BINARY TREE

(71) Applicant: Dassault Systemes, Velizy Villacoublay (FR)

(72) Inventor: Jean-Francois Rameau, Lisses (FR)

(73) Assignee: Dassault Systemes, Velizy Villacoublay (FR)

( * ) Notice: Subject to any disclaimer, the term of this patent is extended or adjusted under 35 U.S.C. 154(b) by 606 days.

(21) Appl. No.: 14/475,904

(22) Filed: Sep. 3, 2014

(65) Prior Publication Data
US 2015/0073753 A1 Mar. 12, 2015

(30) Foreign Application Priority Data

Sep. 11, 2013 (EP) .................................. 13306244

(51) Int. Cl.
*G06F 17/50* (2006.01)
*G06T 17/10* (2006.01)
*G06T 17/00* (2006.01)

(52) U.S. Cl.
CPC ............ *G06F 17/50* (2013.01); *G06T 17/005* (2013.01); *G06T 17/10* (2013.01)

(58) Field of Classification Search
CPC ....................................................... G06F 17/50
USPC .............................................................. 703/1
See application file for complete search history.

(56) References Cited

U.S. PATENT DOCUMENTS

| | | | |
|---|---|---|---|
| 6,034,958 A * | 3/2000 | Wicklund | H04L 45/745 370/395.32 |
| 2004/0006569 A1* | 1/2004 | Carlin | G06F 17/22 |
| 2004/0193632 A1* | 9/2004 | McCool | G06F 17/30091 |
| 2004/0243553 A1* | 12/2004 | Bailey | G06F 17/30961 |
| 2005/0083937 A1* | 4/2005 | Lim | H04L 45/7453 370/392 |
| 2008/0256362 A1* | 10/2008 | Takenaka | G06F 21/6254 713/180 |
| 2010/0146003 A1* | 6/2010 | Bruso | G06F 17/30327 707/797 |

FOREIGN PATENT DOCUMENTS

EP  1 501 026 A1  1/2005

OTHER PUBLICATIONS

S. Rao Kosaraju, Optimal parallel Evaluation of Tree-Structured Computations by Raking, 2005.*

(Continued)

*Primary Examiner* — Lechi Truong
(74) *Attorney, Agent, or Firm* — Hamilton, Brook, Smith & Reynolds, P.C.

(57) ABSTRACT

A computer-implemented method for designing an industrial product modeled with a binary tree having leaf nodes representing basic volumes, non-leaf nodes representing binary commutative operation combining volumes, the method comprising the steps of:
  performing a design operation triggering the adding or the removing of a leaf node; and
  idealizing the binary tree, i.e. modifying the binary tree while maintaining the optimality of the tree by minimizing the number of weak leaf nodes, a weak leaf node being a leaf node such that, when removed, the resulting binary tree is not optimal anymore.

17 Claims, 13 Drawing Sheets

(56) References Cited

OTHER PUBLICATIONS

Extended European Search Report for EP Patent Application No. 13306244.8, "A Computer-Implemented Method for Designing an Industrial Product Modeled With a Binary Tree," dated Feb. 4, 2014 (9 pages).

Goodrich, M.T., "An Improved Ray Shooting Method for Constructive Solid Geometry Models Via Tree Contraction," *International Journal of Computational Geometry & Applications*, 8(1): 1-23 (Feb. 1, 1998), XP009175636.

Yap, C., "Lecture III—Balanced Search Trees," Basic Version, Oct. 20, 2010, pp. 1-51, XP055097446 Retrieved from the Internet URL: http://web.archive.org/web/20120522203512/cs.nyu.edu/yap/book/algo/10/13_BASE.pdf [retrieved on Jan. 21, 2014].

* cited by examiner

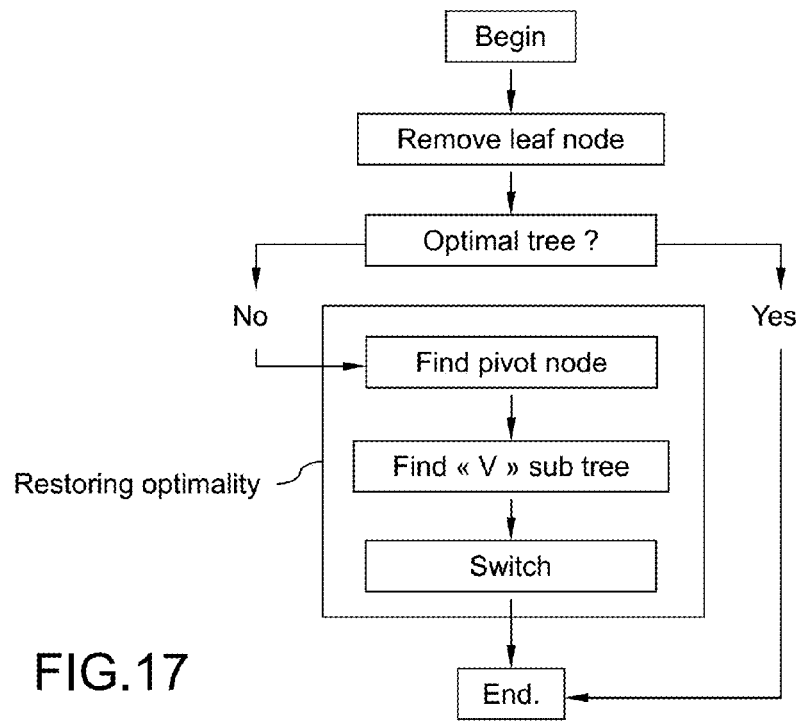
FIG.17
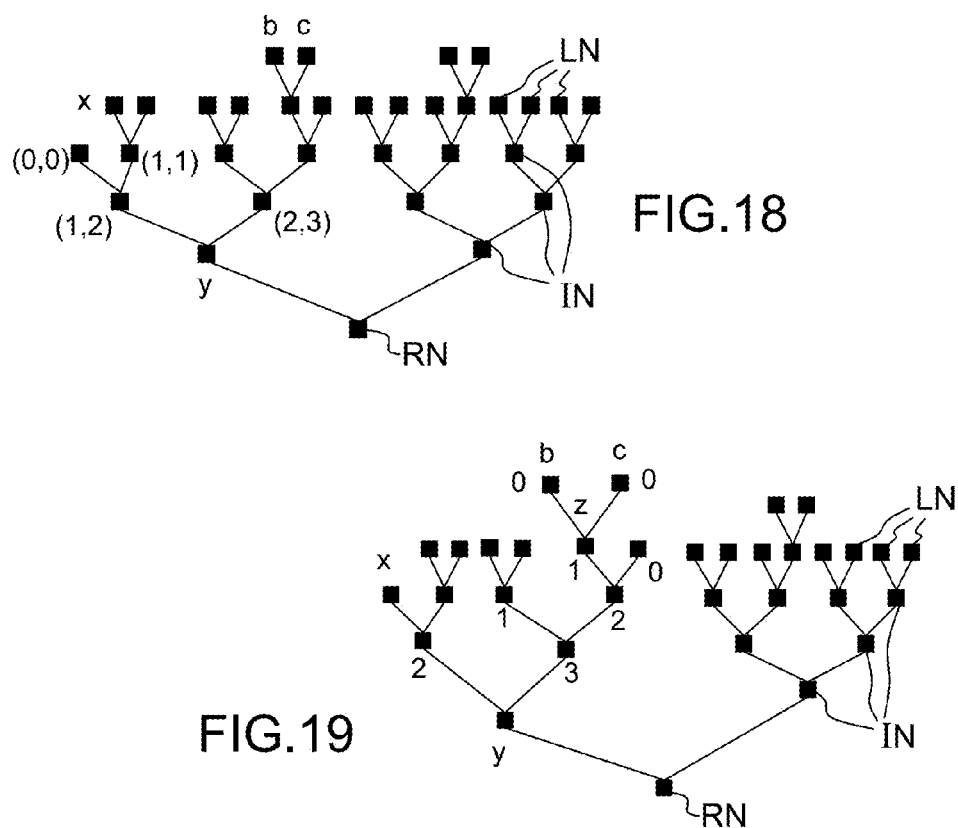
FIG.18
FIG.19

COMPUTER-IMPLEMENTED METHOD FOR DESIGNING AN INDUSTRIAL PRODUCT MODELED WITH A BINARY TREE

RELATED APPLICATION(S)

This application claims priority under 35 U.S.C. §119 or 365 to Europe, Application No. 13306244.8, filed Sep. 11, 2013. The entire teachings of the above application(s) are incorporated herein by reference.

FIELD OF THE INVENTION

The invention relates to the field of computers programs and systems, and more specifically to the field of computer-implemented method for designing an industrial product modeled with a binary tree, for example in computer aided design of acronym CAD.

The invention deals with computer aided design CAD, and more precisely with declarative modeling (also named functional modeling). A declarative modeling CAD system involves a predefined history tree together with declarative features. After the CAD system user instantiates declarative features, the data structure supporting the resulting solid is a history tree including many sub-trees that combine basic volumes through a commutative operation, like union or intersection. The invention takes advantage of this particular circumstance to improve the solid update performance after the user requests a change.

BACKGROUND OF THE INVENTION

Given a predefined history tree, as illustrated on the left drawing of FIG. 1, of a declarative modeling system, and given the input buckets of the predefined history tree, declarative features, when instantiated, spread basic volumes among input buckets. Consequently, after some features are instantiated, each input bucket combines a plurality of basic volumes through a commutative operation (mainly a Boolean union noted "+"). Currently, each combination of basic volumes is implemented by an ordered list where volumes are stored according to creation sequence, as illustrated by the right drawing of FIG. 1. On figures, the root node is noted RN, leaf nodes are noted LN, and internal nodes are noted IN, and arcs or edges link nodes.

It should be noticed that the update of a declarative solid involves two steps. The first step is to update input buckets (lists of unions of basic volumes) and the second step is to update the predefined history tree, where commutative and non-commutative operations are stored. According to industrial testing, the very first implementation of declarative modeling technology shows that overall computing time is mainly spent in the predefined history tree update (as opposed to input buckets update time). But, recent performance enhancements in this field (through ongoing Dassault Systèmes (Assignee) patents: EP2474928, EP2474929 and EP2474930) reduced the update time of the predefined history tree in such a way that the basic volumes update time is now significant, and thus deserves optimization.

As it will be detailed in the following, the invention makes an intensive use of the "optimal binary tree" concept. This concept is well known in the art of sorting and searching ordered data (named "records") in a dictionary. According to the art of sorting and searching, the so called "binary search tree" is updated each time a new record is added to the dictionary and its structure is designed to facilitate searching a given record. The searching efficiency is based on the binary tree balance. For this purpose, elaborated algorithms exist to maintain this balance each time a new record is added to the dictionary. Searching skill is used for database management as well as computational geometry. The classical reference is the book of D. Knuth: "Sorting and searching".

As explained before, each input bucket of the predefined history tree combines its basic volumes through an ordered list. When the user modifies a declarative feature of the part, basic volumes modifications (deletion, dimension change, position change . . . ) are executed and input buckets need to be updated. This results in a large update time because updating each list is proportional to the age of the modified volume. It is well known from the solid modeling art that an ordered list is not the best structure from the update time point of view.

Another problem of the background art is the following. Declarative modeling technology is designed to behave independently of features creation order. Dassault Systèmes (Assignee) patent EP1501026 guarantees that the shape of the resulting solid is independent of the features creation order. But, the list implementation of input buckets makes the update of an early feature longer than the update of a late feature, which clearly contradicts the user perception of what should be a declarative behavior.

The art of searching is to maintain the balance of the binary search tree. The topology of the binary search tree captures a structure that is highly related to the fact that leaf nodes are ordered records. For example, the typical requirement is that all nodes of the left sub tree are lower (according to the records ordering) than all nodes of the right sub tree. This is the source of the complexity of balancing algorithms.

SUMMARY OF THE INVENTION

A goal of the invention is to provide a computer-implemented method and a system to overcome the above mentioned problems.

It is proposed, according to one aspect of the invention, a computer-implemented method for designing an industrial product modeled with a binary tree having leaf nodes representing basic volumes, non-leaf nodes representing binary commutative operation combining volumes and arcs linking nodes, the method comprising the steps of:
  performing a design operation triggering the adding or the removing of a leaf node; and
  idealizing the binary tree, i.e. modifying the binary tree while maintaining the optimality of the tree by minimizing the number of weak leaf nodes, a weak leaf node being a leaf node such that, when removed, the resulting binary tree is not optimal anymore, an optimal binary tree having an absolute value of the depth difference between any two leaf nodes (LN) equal to zero or one.

Keeping such an ideal tree, allows to shorten the time needed by the declarative CAD system to compute the new shape of the solid after the user requests a change. Furthermore, the declarative CAD system response time is smoother, meaning that the update time of a feature does not depend on its creation date. In other words, the update time of any feature is approximately the same, and, in the average, shorter that the state of the art technology.

A faster update is a valuable improvement since, in CAD industry, 80% of design time is spent through modifications as opposed to 20% of design time spent through creation of new models from scratch. Time saved through performance enhancement can shorten the time-to-market of a new product or can be used to investigate alternate designs.

By shortening the overall update time and by smoothing the update time disproportion among features, the invention makes the declarative CAD system more comfortable to use.

The invention makes use of optimal binary trees in a context that is much simpler than searching ordered records in a dictionary. Indeed, all non leaf nodes of the binary tree are the same commutative operation (mainly Boolean union) and all leaf nodes are basic volumes. This greatly simplifies the situation and the efficiency of the invention's algorithms is a result of their straightforwardness. As a consequence, computer programs are easier to design, to test and to maintain, they are more reliable. It should be noticed that algorithms dealing with binary trees for searching purpose are not reusable in the context of the invention.

According to an embodiment, the computer-implemented method comprises, when the design operation is the adding of a new leaf node, the steps of:
  determining a path of nodes by traversing the binary tree, from the root node to an existing leaf node, by iteratively choosing the next node defining a sub-tree having the smallest number of leaf nodes; and
  adding the new leaf node at the existing leaf node ending path.

Thus adding a new leaf node saves or enhances the structure of the tree at a computing cost that is proportional to its depth.

According to another embodiment, the computer-implemented method comprises, when the design operation is the removing of a leaf node, the steps of:
  determining as the non-optimal leaf node on the binary tree, which is no longer optimal, the leaf node with the smallest depth;
  determining, in the path from the non-optimal leaf node to the root node, the pivot node which is the first node which sub-tree is non-optimal;
  determining, in said non-optimal sub-tree of the pivot node, the V-sub-tree which is the sub-tree having two leaf nodes with the deepest depth; and
  switching the non-optimal leaf node and the V-sub-tree.

Thus restoring optimality after a node removal is performed at a calculation cost that is proportional to the depth of the tree.

According to an embodiment, the computer-implemented method further comprises a step of providing a predefined tree for inputting a binary tree adapted for designing a specific industrial product.

Thus the CAD system features a declarative behavior and provides the user with high level design features.

According to an embodiment, for each node of the binary tree, the maximum depth of its sub-tree is stored in a memory. That can limit calculation.

According to an embodiment, for each node of the binary tree, the minimum depth of its sub-tree is stored in a memory. That can limit calculation.

According to an embodiment, for each node of the binary tree, the number of leaf nodes of its sub-tree is stored in a memory. That can limit calculation.

In other words, the memory can be a non-transitory computer readable medium.

According to an embodiment, the binary tree is obtained by converting a non-optimal binary tree to an optimal binary tree.

Thus, it is possible to use a binary tree of an industrial product or object, created without the method according to the invention.

For example, the method further comprising a preliminary step of idealizing any binary tree representing an industrial product, by translating a linear list of leaf nodes representing basic volumes into an ideal binary tree wherein the leaf nodes are the said basic volumes.

Thus it is possible to use a binary tree of an industrial product or object, created without the method according to the invention.

For example, the method further comprising a preliminary step of idealizing any binary tree representing an industrial product, by using a library of pre-computed ideal binary trees according to a relevant range of leaf nodes number, and reading the number of leaf nodes representing basic volumes of a linear list of the binary tree, to load the pre-computed ideal binary tree corresponding to the leaf nodes number and to set the basic volumes of the linear list to the leaf nodes of the pre-computed binary tree.

Thus it is possible to use a binary tree of an industrial product or object, created without the method according to the invention.

It is also proposed, according to another aspect of the invention, a computer-readable medium having computer-executable instructions to cause the computer system to perform the method for designing an industrial product modeled with a binary tree as described above.

It is also proposed, according to another aspect of the invention, a computer program product, stored on a computer readable medium, for designing an industrial product modeled with a binary tree, comprising code means for causing the system to take the steps of the method as described above.

It is also proposed, according to another aspect of the invention, an apparatus for designing an industrial product modeled with a binary tree comprising means for implementing the steps of the method as described above.

It is also proposed, according to another aspect of the invention, an industrial product designed with the method of anyone of claims 1 to 10.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

The invention will be better understood with the study of some embodiments described by way of non-limiting examples and illustrated by the accompanying drawings wherein:

FIGS. 2 to 30 illustrate computer-implemented methods, according to aspects of the invention;

DETAILED DESCRIPTION OF THE INVENTION

A description of example embodiments of the invention follows.

The following figures explain in more detail the functioning of the present invention.

Figure 1:
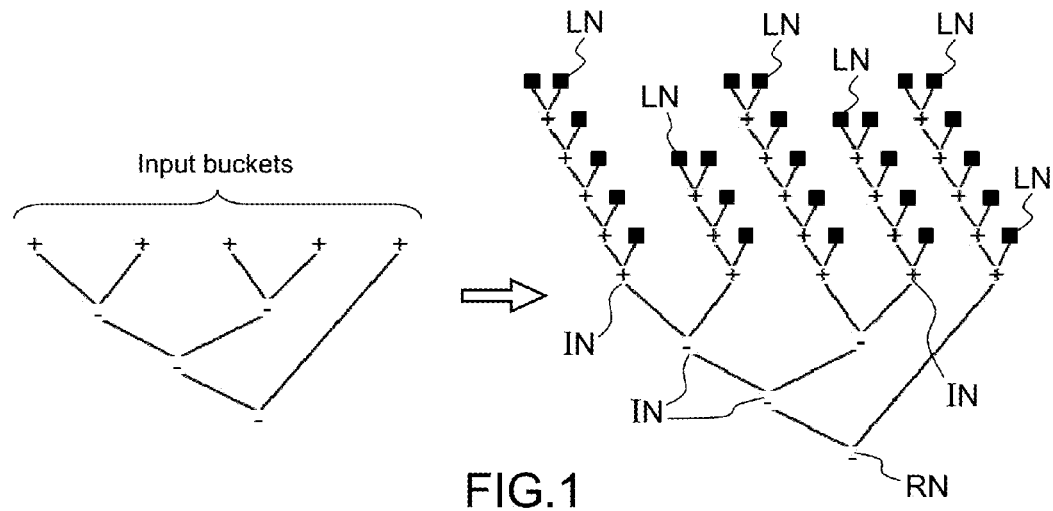
FIG. 1 illustrates an example tree, according to the background art.
Figure 2:
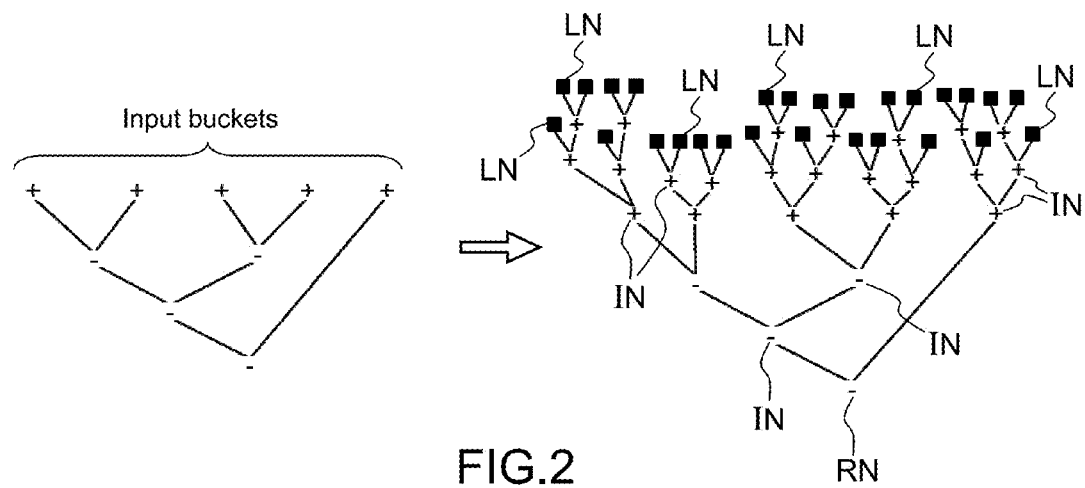

As illustrated on FIG. 2, the invention implements the combination of input bucket's basic volumes through balanced binary trees as opposed to existing ordered lists, as illustrated in the right drawing on FIG. 1. The update time of each input bucket is then proportional to the logarithm of its number of basic volumes, as opposed to the update time of an ordered list which is proportional to its total number of basic volumes. Furthermore, each balanced binary tree is managed in such a way that its shape remains optimal through creation and deletion of basic volumes.

The invention description is focused on the management of one binary tree. Of course, implementing the invention in a declarative CAD system is to put into service as many binary trees as necessary, depending on the predefined history tree structure, each binary tree being managed according to the present description.

The graph definitions used are the followings.

Figure 3:
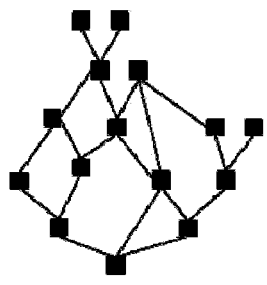
Figure 3:
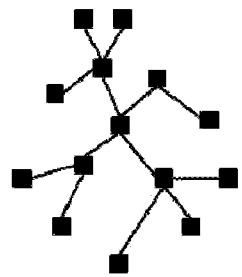

A tree, as illustrated on FIG. 3, is an acyclic graph. A tree includes exactly one more node than the number of arcs. The leftmost graph of FIG. 3 is not a tree (notice the many cycles). The rightmost graph of FIG. 3 is a tree.

Figure 4:
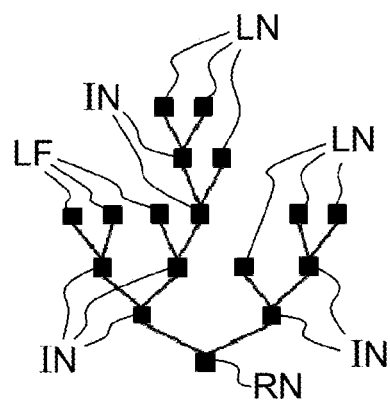

A binary tree, as illustrated on FIG. 4, is a tree featuring one node with two arcs, named the root node RN, a plurality of nodes with three arcs, named internal nodes IN, and a plurality of nodes with one arc, named the leaf nodes LN. Conventionally, drawings will place the root node RN at the lowest position and leaf nodes LN at higher positions, as illustrated on FIG. 4.

All along the present application, p is the number of leaf nodes LN and is written $p=2^q+r$ where q and r are integer numbers such that $0 \leq r < 2^q$. Number q is often written $q=\log_2 p$. It is well known from graph theory (by applying the Euler relationship to binary trees) that the total number of nodes as well as the number of arcs is entirely defined by the number of leaf nodes LN.

Figure 5:
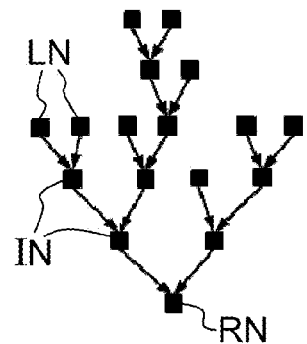

By convention, as represented on FIG. 5, the arcs of a binary tree are oriented from the leaf nodes LN toward the root node RN: top to bottom in the drawings. The root node RN has no output arc and two input arcs, leaf nodes LN have no input arc and one output arc, internal nodes IN have one output arc and two input arcs, as illustrated on FIG. 5. This conventional orientation is chosen according to the data flow captured by the binary tree in the context of the invention. It is implicit in the drawings.

Figure 6:
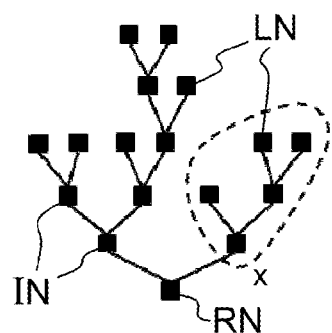

As illustrated on FIG. 6, the sub tree defined by a node x is the tree obtained by cutting the output arc of node x. Consequently, node x is the root node of its sub tree. A leaf node can be viewed as a sub tree.

Figure 7:
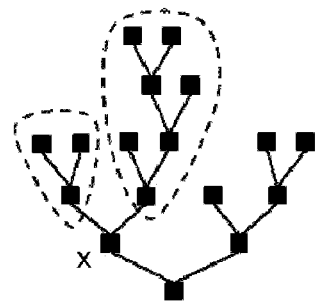

By definition, two sibling nodes have the same output node. On FIG. 7, dotted contours surround two sibling sub trees sharing the same output node x.

Figure 8:
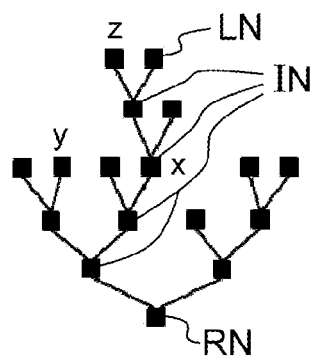

The depth of a node is the number of arcs of the path from the said node to the root node RN. The depth of a tree is the largest leaf node depth. The depth of the root node RN is zero. On FIG. 8, depth of node x is 3, depth of leaf node y is 3, depth of leaf node z is 5, depth of the tree is 5.

Figure 9:
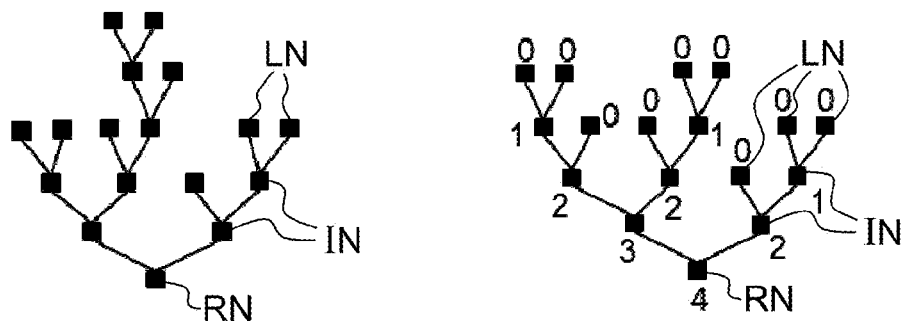

Each non leaf node has two input nodes, conventionally named "left" and "right". By definition, the left sub tree of a given non leaf node is the sub tree defined by its left input node, similarly, the right sub tree is the sub tree defined by its right input node. By definition, a balanced binary tree is such that for each non leaf node, the absolute value of the depth difference between its left and right sub trees is lower or equal to one. The leftmost tree on FIG. 9 is not balanced while the rightmost tree is balanced (nodes are labeled with their respective sub tree depths).

An optimal binary tree OBT is a particular balanced binary tree. By definition, the absolute value of the depth difference between any two leaf nodes LN of an optimal binary tree equals zero or one. In other words, there exist at most two depth levels for leaf nodes LN, as illustrated on FIG. 10. The balanced binary tree on FIG. 9 is not optimal, while the leftmost balanced binary tree on FIG. 10 is optimal.

Figure 10:
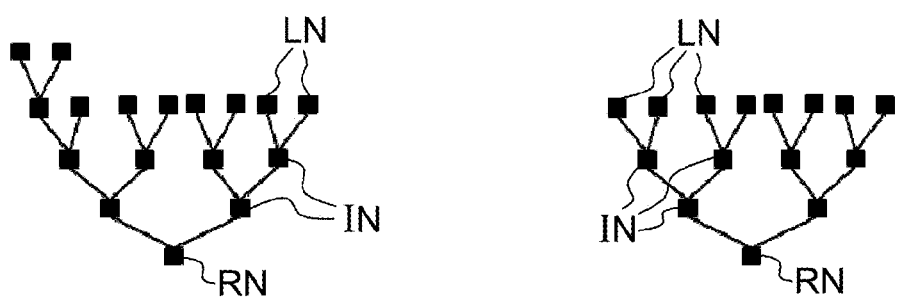

By definition, all leaf nodes LN of a perfect binary tree have the same depth, as illustrated in the rightmost of FIG. 10. The number of leaf nodes LN of a perfect binary tree is always an integer power of 2 meaning that $p=2^q$. Consequently, the depth of any leaf node LN of an optimal binary tree with $p=2^q+r$ leaf nodes LN is either q or q+1. The following property is well known from previous art: an optimal binary tree features the smallest depth among all binary trees having the same number of leaf nodes LN.

Figure 11:
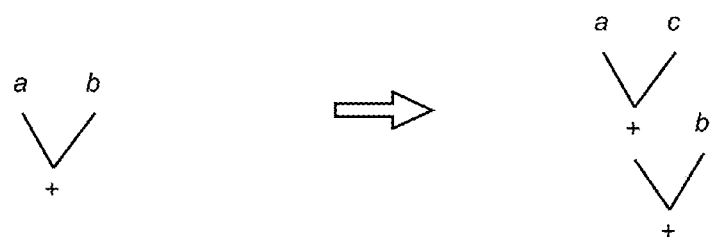

Operations performed on binary trees and used in the invention are "adding a new leaf node" and "removing an existing leaf node". The adding operation is performed as follows. Given an existing leaf node a symbolically representing a basic volume and given a new basic volume named c , the adding operation is to replace leaf node a by the sub tree defined by root node + and leaf nodes a and c, as illustrated on FIG. 11.

Clearly, adding a leaf node may increase the binary tree depth.

Figure 12:
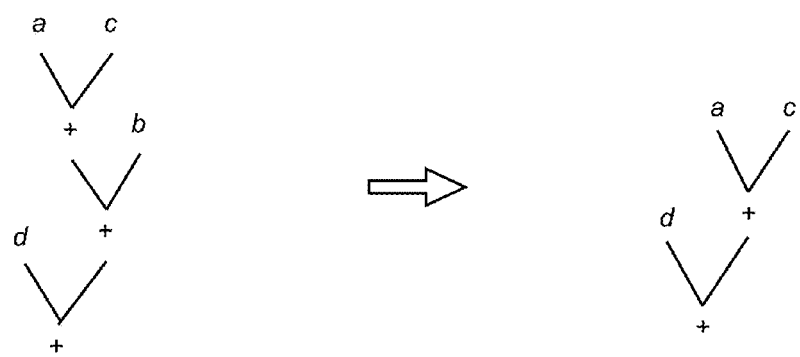

The removing operation is performed as follows. Removing a leaf node LN of a binary tree is to replace its output node by the root node RN of its sibling sub tree. For example, on FIG. 12, removing leaf node b is to replace the output node + of node b by the root node + of the sibling sub tree a+c of leaf node b.

Clearly, removing a leaf node LN may decrease the binary tree depth.

So far, all definitions and properties are known from previous art. They may differ from one reference to another; this is why they are precisely recalled. Up to our knowledge, next definitions are original to the invention.

Figure 13:
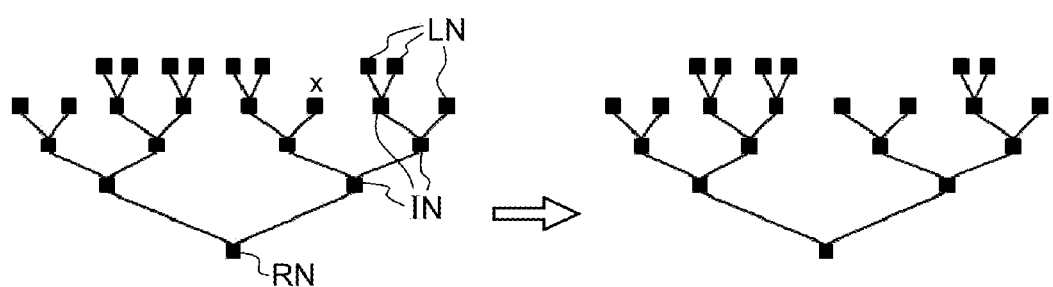

Now is defined the notion of weak leaf node WLN of an optimal binary tree. Given an optimal binary tree, a weak leaf node is, by definition, a leaf node such that, when removed, the resulting binary tree is not optimal anymore. For example, on FIG. 13, removing leaf node x does not break optimality.

Figure 14:
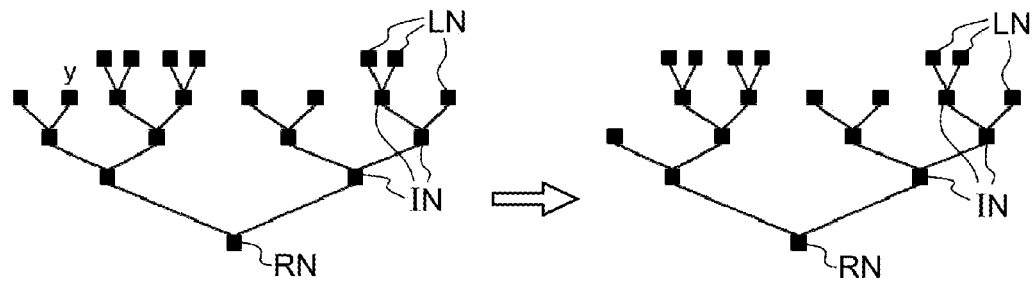

Conversely, removing node y , on FIG. 14 actually breaks optimality, which makes leaf node y a weak leaf node WLN. Rightmost tree is not optimal because there are three leaf nodes depth values: 2, 3 and 4.

A weak leaf node is characterized as follows. Its depth is q, its sibling node is a leaf node LN (and not a sub tree) and there exists somewhere in the binary tree a node with depth q+1.

Figure 15:
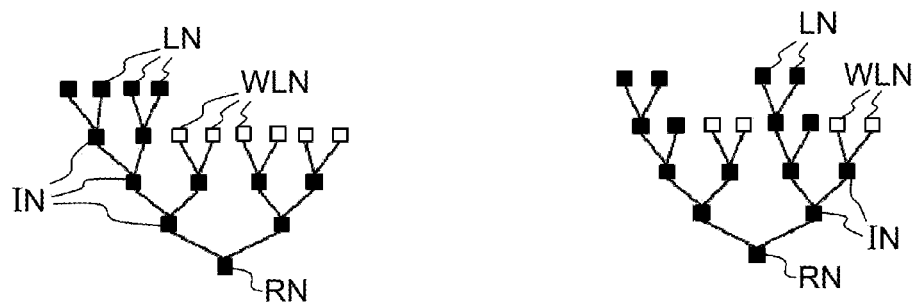

Now is defined an ideal binary tree IBT. By definition, an ideal binary tree IBT is an optimal binary tree OBT featuring the minimum number of weak leaf nodes WLN. As illustrated on FIG. 15, not all optimal binary trees OBT are ideal. The leftmost binary tree is optimal but not ideal while the rightmost binary tree is ideal. They both have ten leaf nodes LN, the leftmost binary tree has six weak leaf nodes WLN, and the rightmost binary tree has four weak leaf nodes WLN. Weak leaf nodes WLN are white squares.

The number of weak leaf nodes $\phi$ of an optimal binary tree OBT with $p=2^q+r$ leaf nodes LN is bounded from below by the smallest number of weak leaf nodes $\phi_{min}$ and is bounded from above by the largest number of weak leaf nodes $\phi_{max}$, meaning that $\phi_{min} \leq \phi \leq \phi_{max}$ where $\phi_{min}=0$ if $r=0$ and $\phi_{min}=\max\{0,2^q-2r\}$ if $r\neq 0$ and where $\phi_{max}=0$ if $r=0$ and $\phi_{max}=2^q-2\mathrm{div}(r+1,2)$ if $r\neq 0$.

Notation $\mathrm{div}(a, b)$ is the quotient of the Euclidian division of integer number a by integer number b.

In the context of the invention, leaf nodes LN are volumes and non leaf nodes are a binary commutative operations combining volumes altogether. Furthermore, each non leaf node stores the solid shape resulting from the combination of its two input solids. Each time the user creates or deletes a declarative feature, new leaf nodes LN are added to or removed from binary trees. The following describes algorithms to maintain optimality and ideality of binary trees through any edition sequence. The ideal binary tree concept is useful to reduce loss of optimality at leaf node deletion. Reducing the number of weak leaf nodes WLN reduces as well the probability for the binary tree to lose optimality and for the system to restore optimality.

Given an existing binary tree, and given a new leaf node LN to be added to the said binary tree, the "ideal growth algorithm" computes the best existing leaf node LN where to add the new leaf node LN. The data structure saves, for each node, the number of leaf nodes LN of its sub tree. In other words, each node x knows the number of leaf nodes LN of its sub tree, noted $\lambda(x)$ with $\lambda(x)=0$ if x is a leaf node LN. The algorithm starts with the root node RN and visits the input node of the current node featuring the smallest number $\lambda$ until a leaf node LN is reached.

```
x := the root node
While x is not a leaf node do begin
    y := the left input node of x
    z := the right input node of x
    If λ(y) ≤ λ(z) then
        x := y
    Else
        x := z
    End if
End while
Return x
```

Figure 16:
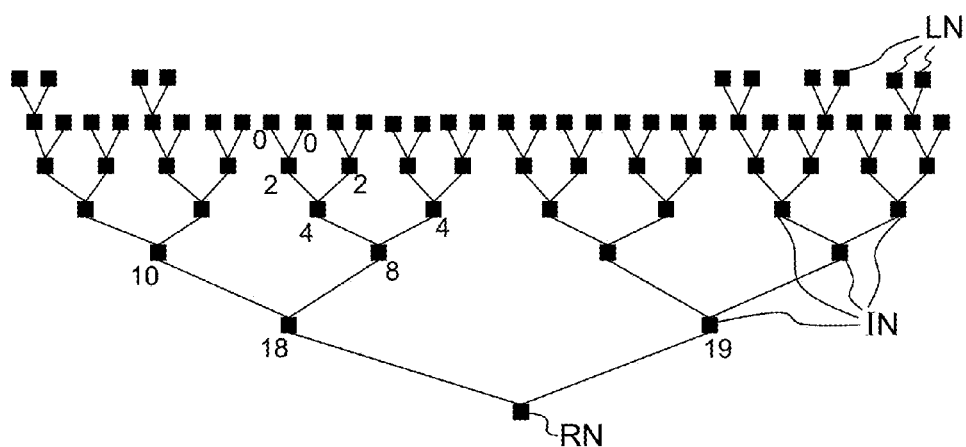

On FIG. 16 below, the best place for a new leaf node is pointed by the arrow. Nodes visited by the algorithm are labeled with their respective $\lambda$ numbers.

Clearly, the computational cost for finding the best leaf node LN is proportional to the binary tree depth.

It should be noticed that previous algorithm works even when the binary tree is not ideal. Starting with a non ideal tree, ideality is reached after a finite number of added leaf nodes LN. Starting with an ideal tree IBT and adding a new leaf node LN at the place prescribed by the algorithm provides a new ideal tree IBT.

Restoring optimality is illustrated on FIG. 17.

Removing a weak leaf node WLN from an optimal binary tree OBT yields a binary tree that is no more optimal. Indeed, the removing operation creates a so called "non optimal leaf node", which is the unique leaf node LN with depth q−1, keeping in mind that there exists somewhere else in the binary tree at least one leaf node LN with depth q and at least one leaf node LN with depth q+1.

The input data of the optimality restoration algorithm are a binary tree equipped with the appropriate data structure (described in the following) together with
(a pointer to) its unique non optimal leaf node, noted x.

The algorithm includes three steps: find the pivot node PN which is the first node which sub-tree is non-optimal, find the "V" sub-tree (a V-sub-tree being a sub-tree including two leaf nodes and a root node) and switch the non optimal leaf node LN with the V sub-tree.

The following data structure is used. Each node s is labeled with two integer numbers: the maximum depth of its sub tree $d_{max}(s)$ and the minimum depth of its sub tree $d_{min}(s)$. If the binary tree is optimal, then for any node t the following optimality condition, noted c(t), is true:

$$0 \leq d_{max}(u) - d_{min}(v) \leq 1 \text{ and } 0 \leq d_{max}(v) - d_{min}(u) \leq 1$$

wherein u,v are the input nodes of node t. If node t is a leaf node, then $d_{max}(t)=d_{min}(t)=0$.

The step of finding the pivot node PN can be realized as follows. The pivot node finder algorithm starts from the non optimal leaf node x and progresses towards the root node RN to find the so called pivot node PN, noted y. The pivot node PN is the first node on the path featuring a false optimality condition.

```
s := the output node of x
While c(s) is true do begin
    s := the output node of s
End while
y := s
```

FIG. 18 illustrates the pivot node PN finding process. The found pivot node is y. Nodes visited by the algorithm are labeled with $(d_{min},d_{max})$ numbers.

The step of finding the V-sub-tree with the deepest depth can be realized as follows. Then, the algorithm starts from pivot node y toward leaf nodes and finds a deepest V sub-tree. The root node of this deepest V sub-tree is noted z. The algorithm follows:

```
s := y
While s is not a leaf node do begin
    u := the left input node of s
    v := the right input node of s
    If d_max (u) ≥ d_max (v) then
        s := u
    Else
        s := v
    End if
End while
z := output node of s
```

FIG. 19 illustrates the V sub-tree searching. Nodes visited by the algorithm are labeled with their respective $d_{max}$ numbers.

Figure 20:
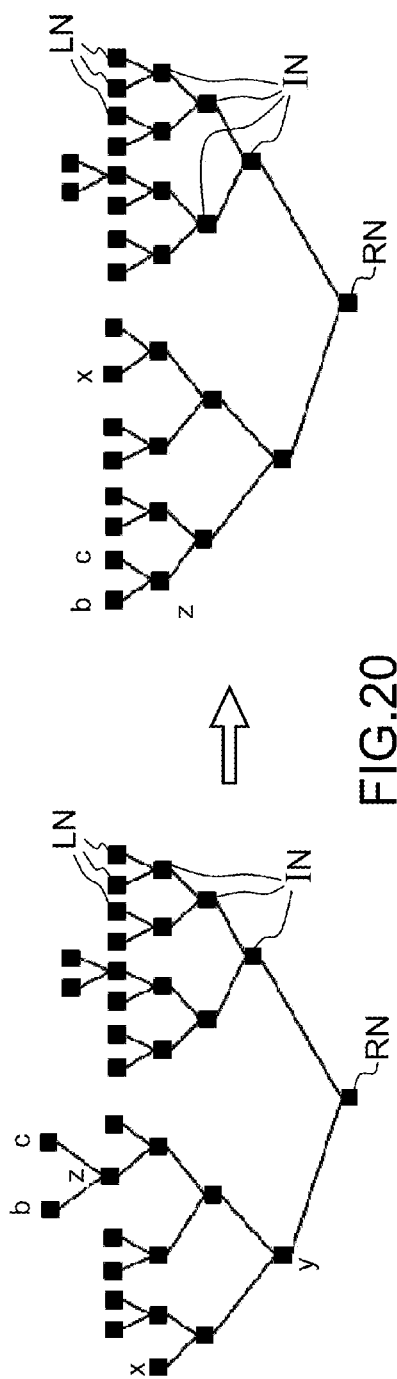

The step of switching is then illustrated on FIG. 20, wherein the root node of this V sub-tree, noted z, is switched with the non optimal leaf node LN, which restores optimality.

Figure 21:
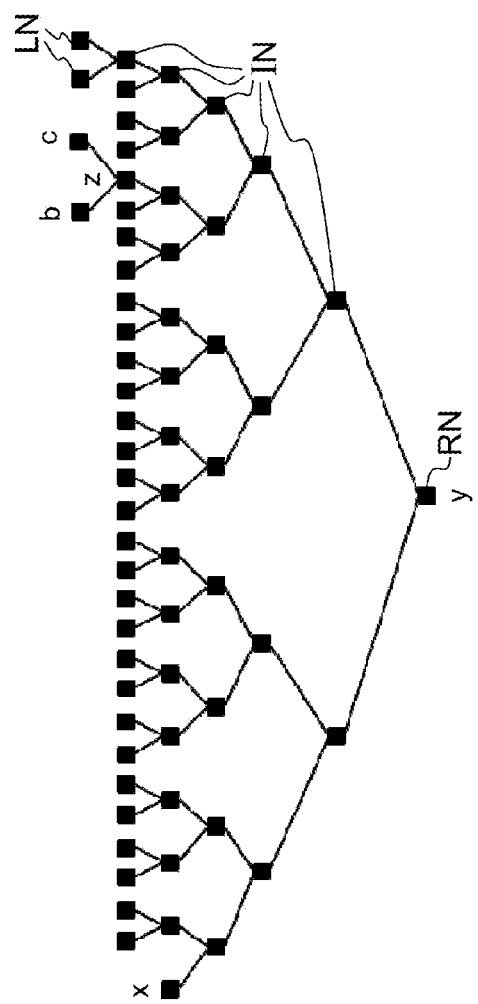

FIG. 21 illustrates the worst case possible. It may happen that the pivot node PN is the root node RN. This occurs when the removed leaf node is located "far" from the deepest leaf nodes. On FIG. 21, a leaf node is previously removed on the left side of the tree, giving birth to the non optimal leaf node x. Since the deepest leaf nodes are located on the right side of the tree, the pivot node y is the root node. Even in this worst case, the computational cost of optimality restoration is proportional to the depth of the binary tree.

Figure 22:
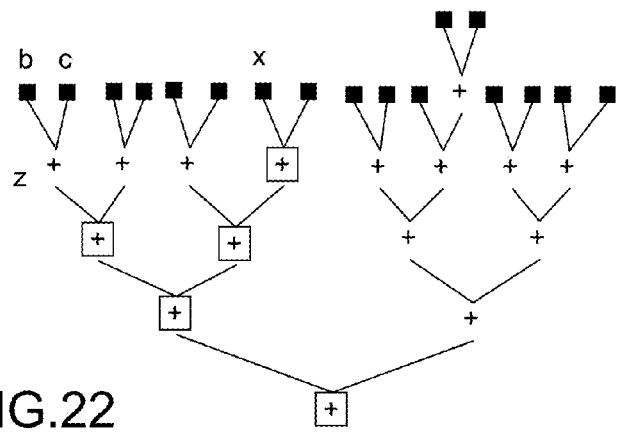

Optimality restoration reorganizes the binary tree in such a way that some solid modeling updating is required to get the new solid shape. Operations to be replayed are located on the paths from modified nodes to the root node RN. These operations are the boxed "+" on FIG. 22. In other words, nodes represented as boxed "+" are nodes to recalculate following a change.

Figure 23:
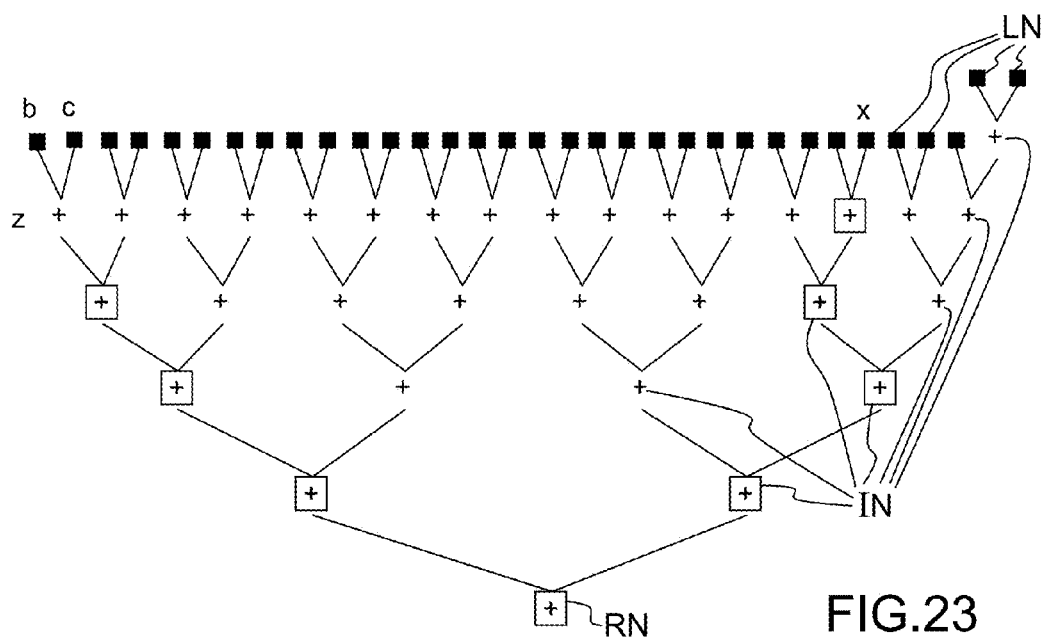

FIG. 23 represents the worst case optimality restoration. Clearly, the number of "+" operations to replay cannot exceed twice the depth of the binary tree. Here again, the computational complexity is proportional to the binary tree depth.

The core of the present invention is to restore the ideality of the binary tree.

Removing a weak leaf node WLN from an ideal binary tree IBT and restoring optimality through the previous algorithm yields an ideal binary tree IBT (which is better than an optimal binary tree OBT, i.e. an optimal binary tree OBT, the number of weak leaf nodes minimized, a weak leaf node being a leaf node such that, when removed, the resulting binary tree is not optimal anymore).

Now follows a proof of the invention.

Figure 24:
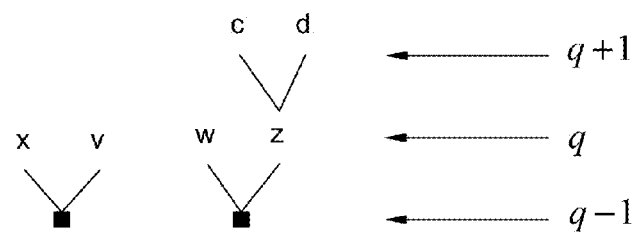

Let v be a weak leaf node WLN of an initial ideal binary tree IBT with $p=2^q+r$ leaf nodes. Then, three facts must be noticed. Firstly, the depth of leaf node v is q. Secondly, the sibling sub tree of node v is in fact another leaf node noted x (with depth q as well). Otherwise the V shape sibling sub tree of v would save optimality after v is removed. Thirdly, there exists somewhere in the initial binary tree at least one leaf node LN with depth q+1. This is illustrated on FIG. 24.

Figure 25:
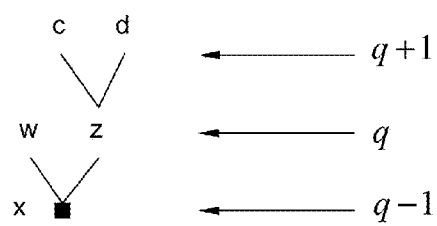

After leaf node v is removed, its former sibling leaf node x comes down with depth q−1, thus breaking optimality. This is illustrated on FIG. 25.

Figure 26:
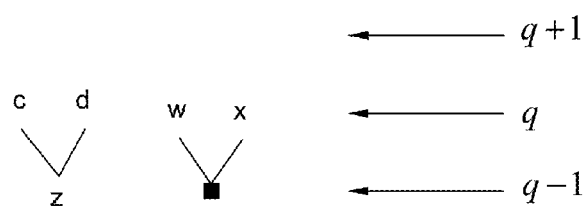

In order to restore optimality, the algorithm finds a V sub-tree, the root node RN of which is noted z and switches nodes z and x. The key point is that the sibling tree of z is a leaf node, noted w, and not another V sub-tree. (Otherwise, the initial binary tree would not be ideal. Indeed, we can suppose that the sibling sub-tree of node z is a V sub-tree. Then, switching this V sub-tree with leaf node v or x on the initial binary tree would decrease the number of weak leaf nodes WLF while saving the total number of leaf nodes LN, which contradicts the ideality hypothesis of the initial binary tree.) So, after weak leaf node v is removed and after nodes x and z are switched, two situations are possible. If there is no more leaf node LN with depth q+1, the resulting binary tree is perfect because all leaf nodes LN have the same depth, which is a particular ideal binary tree. If there exist somewhere in the tree other leaf nodes LN with depth q+1, then two new weak leaf nodes WLN are created. This is because the two initial weak leaf nodes x and v are now replaced by four weak leaf nodes: x, w and the two leaf nodes of the V sub tree, noted c, d in the drawings, like illustrated on FIG. 26.

Since the total number of leaf nodes LN is now p−1, the resulting optimal binary tree OBT is ideal IBT. Indeed, in this context, the number of weak leaf nodes WLN of the initial (and ideal) binary tree IBT is $\varphi_{min}(p)=2^q-2r$. After the weak leaf node WLN removal and the optimality restoration, the number of weak leaf nodes WLN of the resulting optimal binary tree OBT is $\varphi_{min}(p)+2$. But, $$\varphi_{min}(p) + 2 = 2^q - 2r + 2$$
$$= 2^q - 2(r-1)$$
$$= \varphi_{min}(p-1)$$

This means that the resulting optimal binary tree OBT is ideal IBT since it has p−1 leaf nodes LN, which ends the proof.

Figure 27:
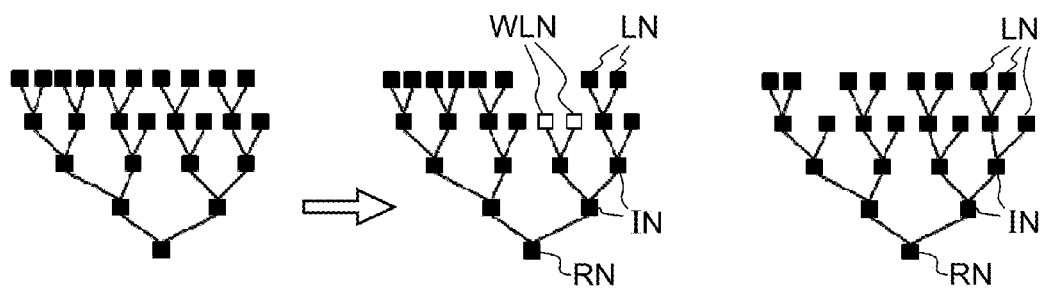

It should be noticed that deleting a non weak leaf node of an ideal binary tree IBT may lose ideality, (while saving optimality) as illustrated on FIG. 27. Deleting the pointed leaf node of the leftmost ideal binary tree yields the center binary tree. Its weak leaf nodes are white squares. It is optimal but not ideal because an ideal binary tree with the same number of leaf nodes features no weak leaf node WLN.

The ideal growth algorithm restores ideality after a sufficient number of leaf nodes are added. Furthermore, restoring the optimality of a previously optimal, but not ideal, binary tree does not generally yield an ideal binary tree IBT. In other words, the invention saves optimality of binary trees. Ideality is saved through growth and optimality restoration.

Figure 28:
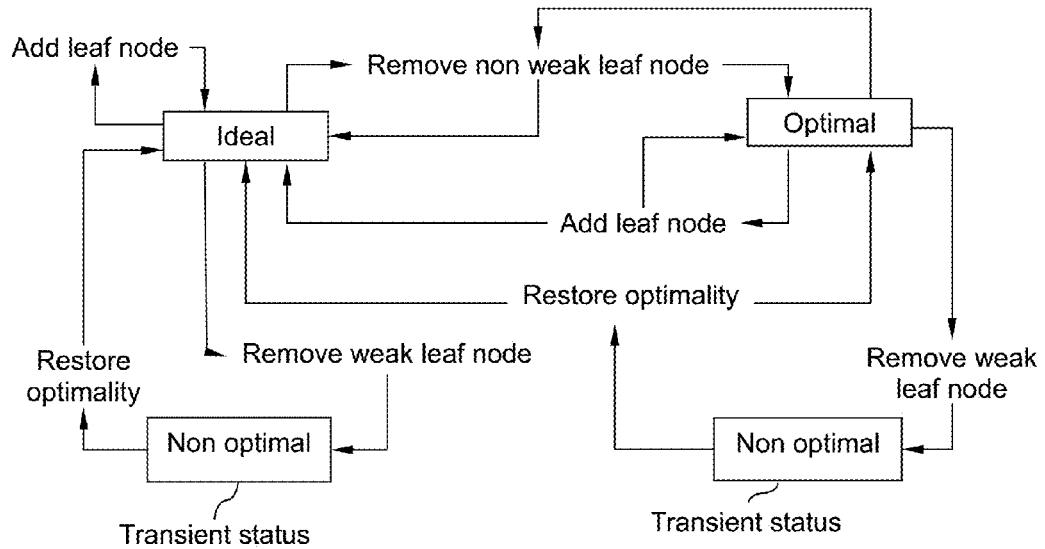

FIG. 28 captures all possible status of the binary tree, including ideal binary tree, optimal (but non ideal) binary tree and non optimal binary tree. It also gathers all possible status changes through operations performed on the binary tree, including adding a leaf node LN (according to the ideal growth algorithm), removing a weak leaf node WLN, removing a non weak leaf node and restoring optimality. Non optimal status is transient, meaning that the algorithm instantaneously restores optimality as soon as it is lost.

Figure 29:
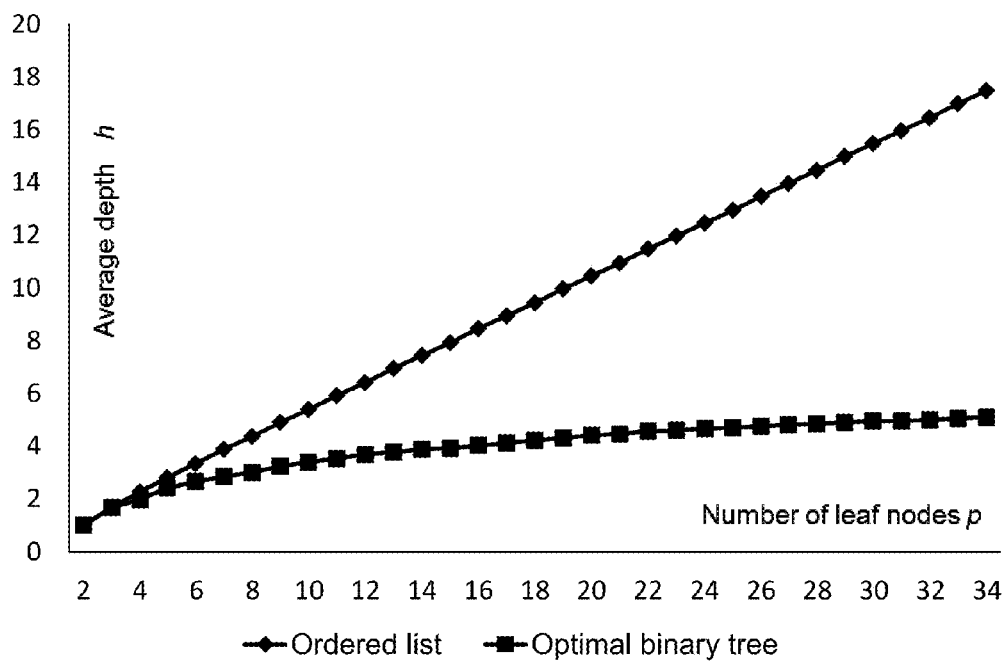

According to previous description, all operations performed on the optimal binary tree OBT are proportional to its depth, which is the logarithm of the number of leaf nodes LN. These operations are: removing a leaf node, adding a leaf node, restoring optimality, or updating the solid. Conversely, operations performed on a linear list are mainly proportional to the total number of leaf nodes LN. Under the industrial hypothesis that all basic volumes have the same probability to be modified or deleted, the following diagram compares the average computational growth between optimal binary tree and ordered list. The binary tree option is clearly advantageous compared to ordered list, as illustrated on FIG. 29.

Noting $p=2^q+r$ the number of leaf nodes LN, the average depth of the optimal binary tree OBT is $$h_{Opt}(p) = q + \frac{2r}{p}.$$

The average depth of the ordered list is $$h_{List}(p) = \frac{p+1}{2} - \frac{1}{p}.$$

Appropriate data structure is a binary tree together with additional information stored at each node. Binary tree data structures, pointers and navigation functions are classical in the art. Beyond this, the invention requires that each node is able to provide the following numerical data: the maximum depth of its sub tree, the minimum depth of its sub tree and the number of leaf nodes LN of its sub tree. These data are maintained up to date by the operations (removing a leaf node, adding a leaf node, restoring optimality) at a cost that is, at most, proportional to the depth. The overall logarithmic computational complexity of the algorithm is preserved. In other words, the data structure management does not raise complexity.

The following properties of optimal binary trees OBT may help implementation. The first point is that all sub trees of an optimal binary tree are optimal binary trees as well. The second point is that given $p=2^q+r$ the number of leaf nodes LN of an optimal binary tree, with $0 \leq r < 2^q$, the number of leaf nodes with depth q is $2^q-r$ and the number of leaf nodes with depth q+1 is 2r. Consequently, maximum and minimum depths of an optimal binary tree can be easily computed from its number of leaf nodes. Given p, compute q and r such that $p=2^q+r$ and $0 \leq r < 2^q$. If r=0, then $d_{min}:=q$ and $d_{max}:=q$ otherwise $d_{min}:=q$ and $d_{max}:=q+1$.

Figure 30:
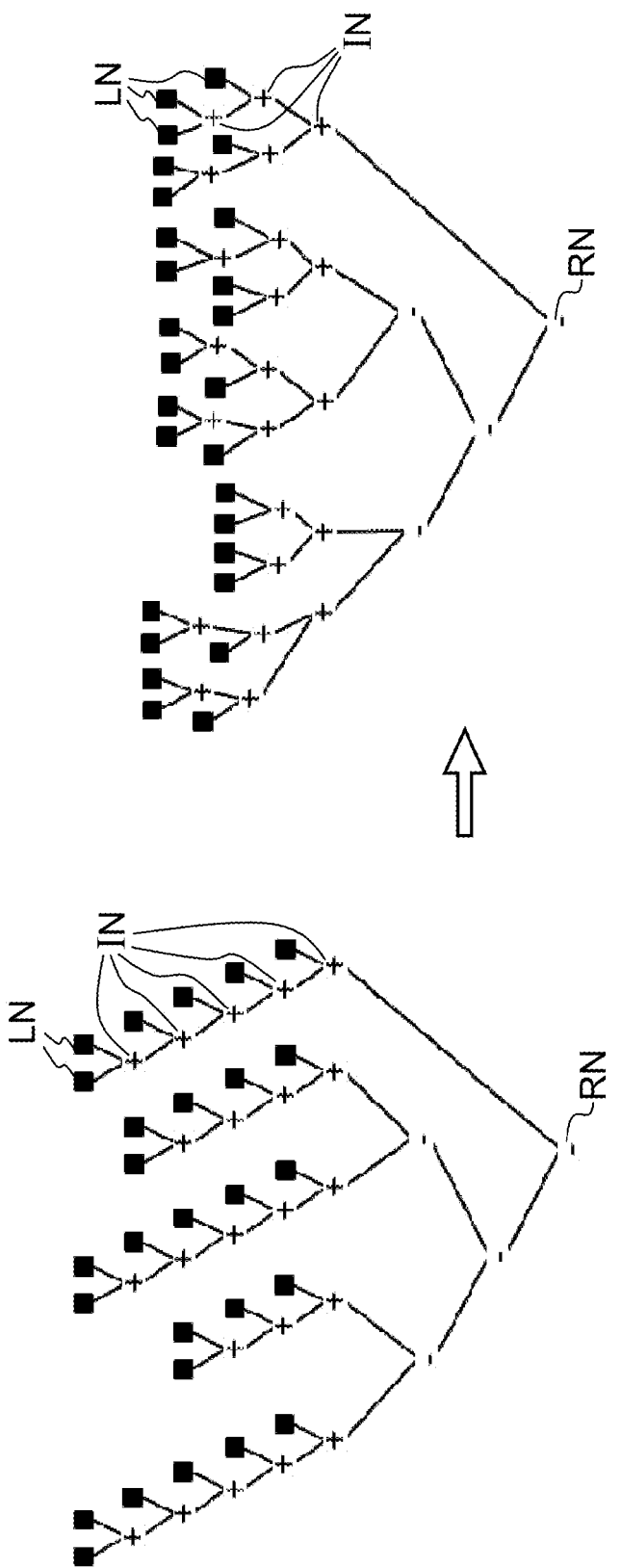

This section describes, like illustrated on FIG. 30, conversion of a part designed according to the state of the art technology (each input bucket is fed with a linear list, left drawing of FIG. 30) to the data format of the invention (each input bucket is fed with an ideal binary tree IBT, right drawing of FIG. 30).

The converter runs an idealization algorithm for each input bucket, which is to translate a linear list of basic volumes into an ideal binary tree IBT the leaf nodes LN of which are the said basic volumes. Then, the converter runs the solid modeling update of the part, which yields the same solid shape.

An idealization algorithm is to create the ideal binary tree step by step as follows:

```
Initiate a new binary tree (an empty binary tree reduced to its root node)
For each basic volume v of the linear list do begin
    Add a new leaf node v to the binary tree
End for
```

Another and faster idealization algorithm involves a library of pre-computed ideal binary trees IBT according to a relevant range of leaf nodes number, typically from p=2 leaf nodes up to p=50 leaf nodes. These are pure logical structures. For each input bucket, the method comprises the reading of the number of basic volumes of its linear list, the loading of the ideal binary tree structure corresponding to this leaf nodes number and the setting of the basic volumes of the linear list to the leaf nodes of the binary tree.

The algorithm choice depends on how large and how frequent the conversions are.

The first use of data conversion is to convert models designed by using a previous version of the CAD system (that does not implement the invention) into models compatible with a version of the CAD system that does implement the invention. In that case, the binary tree is obtained by converting a non-optimal binary tree to an optimal binary tree OBT.

Another use of data conversion is to improve the performance after creation.

Figure 31:
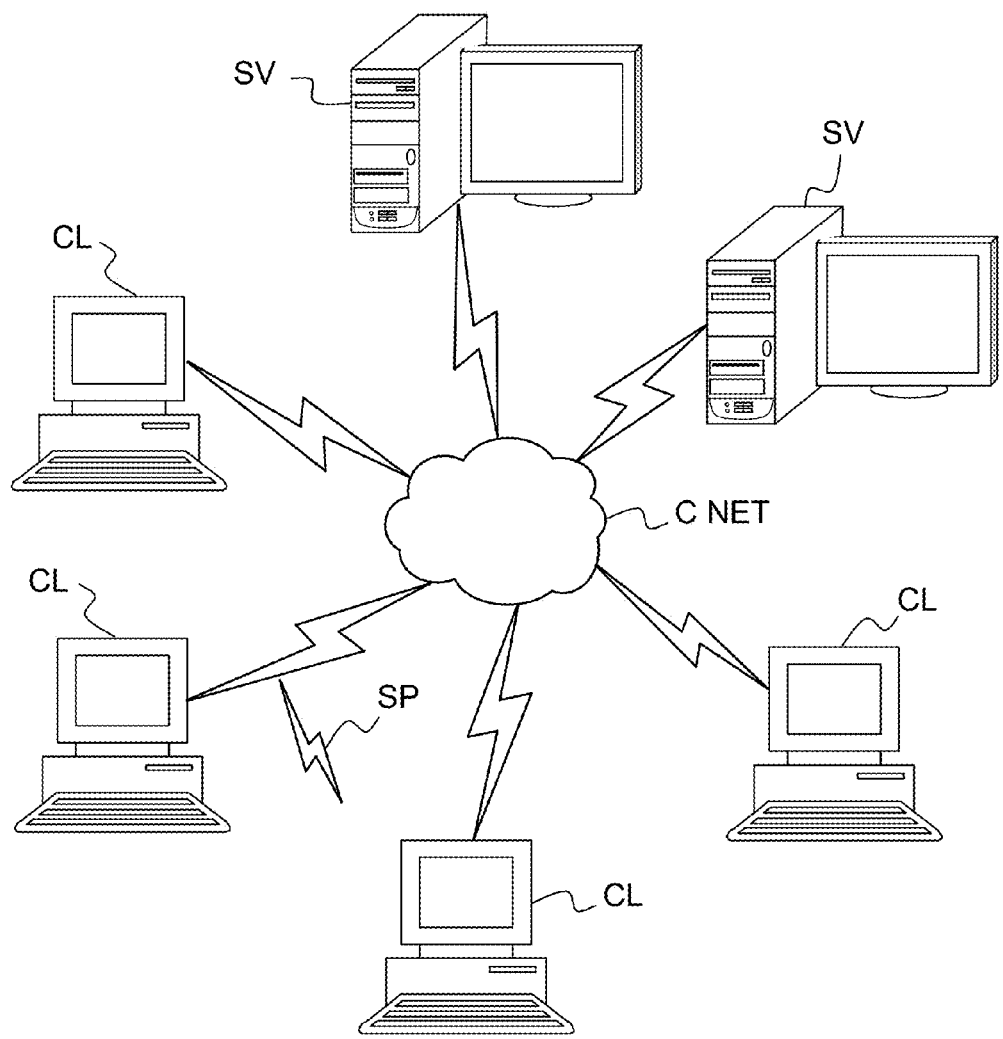
FIG. 31 illustrates a computer network or similar digital processing environment in which the present invention may be implemented.

FIG. 31 illustrates a computer network or similar digital processing environment in which the present invention may be implemented.

Client computer(s)/devices CL and server computer(s) SV provide processing, storage, and input/output devices executing application programs and the like. Client computer(s)/devices CL can also be linked through communications network CNET to other computing devices, including other client devices/processes CL and server computer(s) SV. Communications network 70 can be part of a remote access network, a global network (e.g., the Internet), a worldwide collection of computers, Local area or Wide area networks, and gateways that currently use respective protocols (TCP/IP, Bluetooth, etc.) to communicate with one another. Other electronic device/computer network architectures are suitable.

Figure 32:
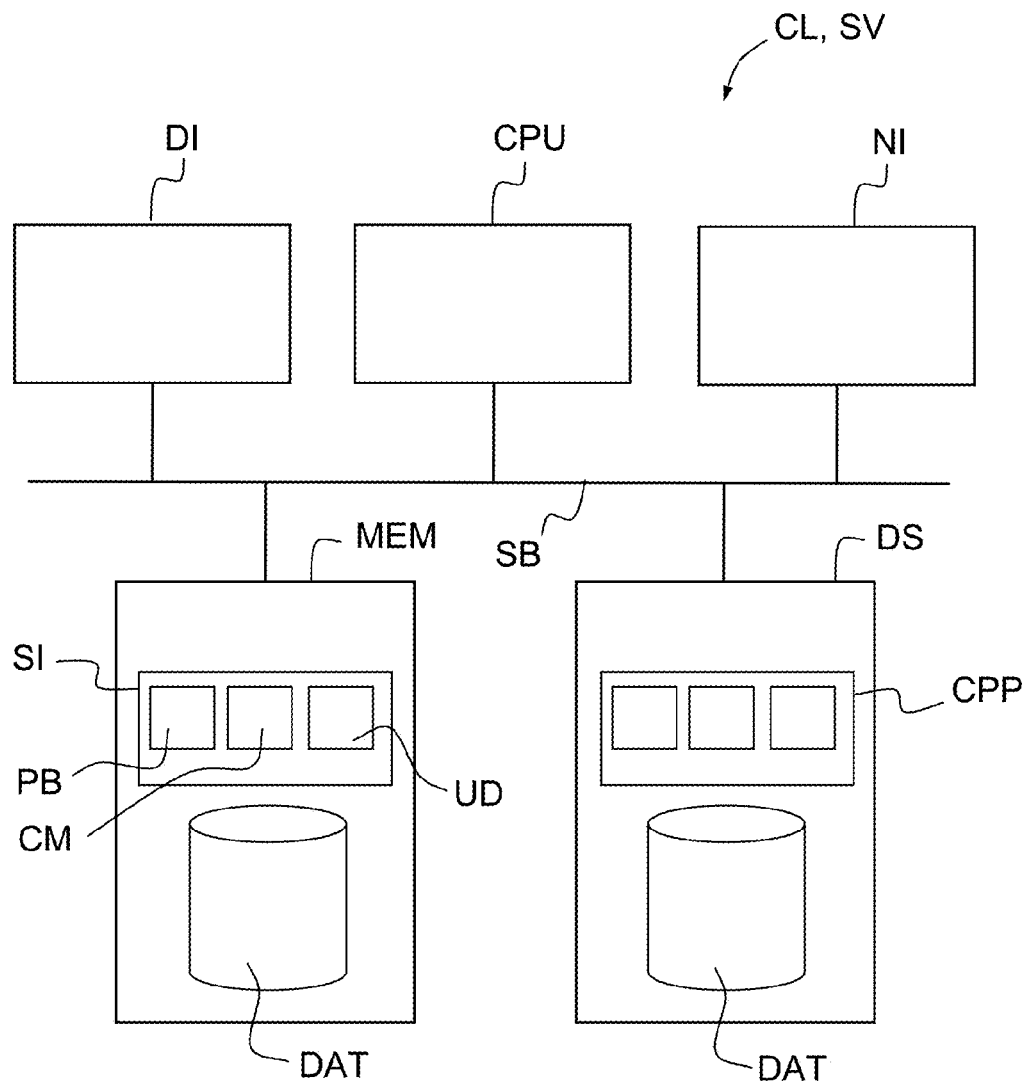
FIG. 32 illustrates a diagram of the internal structure of a computer.

FIG. 32 is a diagram of the internal structure of a computer (e.g., client processor/device CL or server computers SV) in the computer system of FIG. 31. Each computer CL, SV contains system bus SB, where a bus is a set of hardware lines used for data transfer among the components of a computer or processing system. Bus SB is essentially a shared conduit that connects different elements of a computer system (e.g., processor, disk storage, memory, input/output ports, network ports, etc . . . ) that enables the transfer of information between the elements.

Attached to system bus SB is I/O device interface DI for connecting various input and output devices (e.g., keyboard, mouse, displays, printers, speakers, etc.) to the computer CL, SV. Network interface NI allows the computer to connect to various other devices attached to a network (e.g., network CNET of FIG. 31).

Memory MEM provides volatile storage for computer software instructions SI and data CPP used to implement an embodiment of the present invention (e.g., a first path builder PB, means CM for computing a second path, an updater UD implementing the method discussed in FIGS. 1 to 30, and supporting code detailed above).

Disk storage DS provides non-volatile storage for computer software instructions SI and data DAT used to implement an embodiment of the present invention. Central processor unit CPU is also attached to system bus SB and provides for the execution of computer instructions.

In one embodiment, the processor routines SI and data DAT are a computer program product (generally referenced CPP), including a computer readable medium (e.g., a removable storage medium such as one or more DVD-ROM's, CD-ROM's, diskettes, tapes, etc . . . ) that provides at least a portion of the software instructions for the invention system. Computer program product CPP can be installed by any suitable software installation procedure, as is well known in the art.

In another embodiment, at least a portion of the software instructions may also be downloaded over a cable, communication and/or wireless connection. In other embodiments, the invention programs are a computer program propagated signal product SP embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program CPP.

In alternate embodiments, the propagated signal is an analog carrier wave or digital signal carried on the propagated medium. For example, the propagated signal may be a digitized signal propagated over a global network (e.g., the Internet), a telecommunications network, or other network.

In one embodiment, the propagated signal is a signal that is transmitted over the propagation medium over a period of time, such as the instructions for a software application sent in packets over a network over a period of milliseconds, seconds, minutes, or longer.

In another embodiment, the computer readable medium of computer program product CPP is a propagation medium that the computer system CL may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

While this invention has been particularly shown and described with references to example embodiments thereof, it will be understood by those skilled in the art that various changes in form and details may be made therein without departing from the scope of the invention encompassed by the appended claims.

The teachings of all patents, published applications and references cited herein are incorporated by reference in their entirety.

What is claimed is:

1. A computer-implemented method for designing an industrial product comprising:
   modeling the industrial product with an optimal binary tree having leaf nodes (LN) representing basic volumes, non-leaf nodes representing binary commutative operation combining volumes;
   performing a design operation triggering adding or removing a leaf node (LN) of the binary tree;
   modifying the binary tree by minimizing a number of weak leaf nodes (WLN) it contains while maintaining the optimal binary tree (OBT), and
   when the design operation is removing of a leaf node (LN):
      determining as a non-optimal leaf node (LN) on the binary tree, which is no longer optimal, the leaf node (LN) with the smallest depth;
      determining, in a path from the non-optimal leaf node (LN) to the root node (RN), a pivot node (PN) which is the first node which sub-tree is non-optimal;
      determining, in said non-optimal sub-tree of the pivot node (PN), a V-sub-tree with the deepest depth, the V-sub-tree being a sub-tree having two leaf nodes (LN); and
      switching the non-optimal leaf node (LN) and the V-sub-tree;
      wherein a weak leaf node (WLN) is a leaf node (LN) of the optimal binary tree such that, when removed, the binary tree is not optimal anymore, and wherein the optimal binary tree has an absolute value of a depth difference between any two leaf nodes (LN) equal to zero or one.

2. A computer-implemented method according to claim 1, comprising, when the design operation is the adding of a new leaf node (LN), the steps of:
   determining a path of nodes by traversing the binary tree, from a root node (RN) to an existing leaf node (LN), by iteratively choosing a next node defining a sub-tree having the smallest number of leaf nodes (LN); and
   adding the new leaf node (LN) at the existing leaf node (LN) ending path.

3. A computer-implemented method according to claim 1 further comprising a step of providing a predefined tree for inputting a binary tree adapted for designing a specific industrial product.

4. A computer-implemented method according to claim 1 wherein, for each node of the binary tree, a maximum depth of its sub-tree is stored in a memory.

5. A computer-implemented method according to claim 1 wherein, for each node of the binary tree, a minimum depth of its sub-tree is stored in a memory.

6. A computer-implemented method according to claim 1 wherein, for each node of the binary tree, a number of leaf nodes (LN) of its sub-tree is stored in a memory.

7. A computer-implemented method according to claim 1 wherein the binary tree is obtained by converting a non-optimal binary tree to an optimal binary tree (OBT).

8. A computer-implemented method according to claim 7, further comprising a preliminary step of idealizing any binary tree representing an industrial product, by translating a linear list of leaf nodes (LN) representing basic volumes into an ideal binary tree (IBT) wherein the leaf nodes (LN) are the said basic volumes.

9. A computer-implemented method according to claim 7, further comprising a preliminary step of idealizing any binary tree representing an industrial product, by using a library of pre-computed ideal binary trees according to a relevant range of leaf nodes (LN) number, and reading the number of leaf nodes (LN) representing basic volumes of a linear list of the binary tree, to load the pre-computed ideal binary tree (IBT) corresponding to the leaf nodes number and to set the leaf nodes (LN) of the pre-computed binary tree to the basic volumes of the linear list.

10. A non-transitory computer-readable medium having computer-executable instructions operating a computer system, comprising:
    a computer memory embodying computer executable instructions that cause the computer system to design an industrial product by:
    modeling an industrial product modeled with an optimal binary tree having leaf nodes (LN) representing basic volumes, non-leaf nodes representing binary commutative operation combining volumes:
       performing a design operation triggering adding or removing of a leaf node (LN) of the binary tree;
       modifying the binary tree by minimizing a number of weak leaf nodes (WLN) it contains while maintaining the optimal binary tree, and
       when the design operation is removing of a leaf node (LN):
          determining as a non-optimal leaf node (LN) on the binary tree, which is no longer optimal, the leaf node (LN) with the smallest depth;
          determining, in a path from the non-optimal leaf node (LN) to the root node (RN), a pivot node (PN) which is the first node which sub-tree is non-optimal;
          determining, in said non-optimal sub-tree of the pivot node (PN), a V-sub-tree with the deepest depth, the V-sub-tree being a sub-tree having two leaf nodes (LN); and
          switching the non-optimal leaf node (LN) and the V-sub-tree;
          wherein a weak leaf node (WLN) is a leaf node (LN) of an optimal binary tree such that, when removed, the binary tree is not optimal anymore, and wherein an optimal binary tree is a binary tree having an absolute value of a depth difference between any two leaf nodes (LN) equal to zero or one.

11. A computer program product, comprising:
    a non-transitory computer readable medium for designing an industrial product modeled with a binary tree; and
    code means stored on the computer readable medium and configuring a computer system to take the steps of:
    modeling the industrial product with an optimal binary tree having leaf nodes (LN) representing basic volumes, non-leaf nodes representing binary commutative operation combining volumes;
       performing a design operation triggering adding or removing of a leaf node (LN) of the binary tree;

modifying the binary tree by minimizing a number of weak leaf nodes (WLN) it contains while maintaining the optimal binary tree (OBT), and when the design operation is removing of a leaf node (LN):

determining as a non-optimal leaf node (LN) on the binary tree, which is no longer optimal, the leaf node (LN) with the smallest depth;

determining, in a path from the non-optimal leaf node (LN) to the root node (RN), a pivot node (PN) which is the first node which sub-tree is non-optimal;

determining, in said non-optimal sub-tree of the pivot node (PN), a V-sub-tree with the deepest depth, the V-sub-tree being a sub-tree having two leaf nodes (LN); and switching the non-optimal leaf node (LN) and the V-sub-tree;

wherein a weak leaf node (WLN) is a leaf node (LN) of an optimal binary tree such that, when removed, the binary tree is not optimal anymore, and wherein an optimal binary tree is a binary tree having an absolute value of a depth difference between any two leaf nodes (LN) equal to zero or one.

12. An apparatus for designing an industrial product modeled with a binary tree comprising:

a computer system performing a design operation triggering adding or removing of a leaf node (LN) of a binary tree, said binary tree having leaf nodes (LN) representing basic volumes and non-leaf nodes representing binary commutative operation combining volumes;

processor means coupled to the computer system and idealizing the binary tree, including modifying the binary tree while maintaining an optimality of the tree (OBT) by minimizing a number of weak leaf nodes (WLN), a weak leaf node (WLN) being a leaf node (LN) such that, when removed, the binary tree is not optimal anymore, an optimal binary tree having an absolute value of a depth difference between any two leaf nodes (LN) equal to zero or one; and when the design operation is removing of a leaf node (LN):

determining as a non-optimal leaf node (LN) on the binary tree, which is no longer optimal, the leaf node (LN) with the smallest depth;

determining, in the path from the non-optimal leaf node (LN) to the root node (RN), a pivot node (PN) which is the first node which sub-tree is non-optimal;

determining, in said non-optimal sub-tree of the pivot node (PN), a V-sub-tree with the deepest depth, the V-sub-tree being a sub-tree having two leaf nodes (LN); and switching the non-optimal leaf node (LN) and the V-sub-tree.

13. The apparatus as claimed in claim 12 wherein, when the design operation is the adding of a new leaf node (LN), one of the computer system and the processor means:

determines a path of nodes by traversing the binary tree, from a root node (RN) to an existing leaf node (LN), by iteratively choosing a next node defining a sub-tree having the smallest number of leaf nodes (LN); and adds the new leaf node (LN) at the existing leaf node (LN) ending path.

14. The apparatus as claimed in claim 12, further comprising computer means for providing a predefined tree for inputting a binary tree adapted for designing a specific industrial product.

15. The apparatus as claimed in claim 12 wherein, any combination of:

for each node of the binary tree, a maximum depth of its sub-tree is stored in a memory;

for each node of the binary tree, a minimum depth of its sub-tree is stored in a memory; and for each node of the binary tree, a number of leaf nodes (LN) of its sub-tree is stored in a memory.

16. The apparatus as claimed in claim 12 wherein the binary tree is obtained by converting a non-optimal binary tree to an optimal binary tree (OBT).

17. The apparatus as claimed in claim 16 wherein the processor means further, as a preliminary step of idealizing any binary tree representing an industrial product, performs one of:

translating a linear list of leaf nodes (LN) representing basic volumes into an ideal binary tree (IBT) wherein the leaf nodes (LN) are the said basic volumes; and using a library of pre-computed ideal binary trees according to a relevant range of leaf nodes (LN) number, and reading the number of leaf nodes (LN) representing basic volumes of a linear list of the binary tree, to load the pre-computed ideal binary tree (IBT) corresponding to the leaf nodes number and to set the leaf nodes (LN) of the pre-computed binary tree to the basic volumes of the linear list.

* * * * *